(12) United States Patent
Shin et al.

(10) Patent No.: US 7,772,654 B2
(45) Date of Patent: Aug. 10, 2010

(54) METHODS OF FABRICATING NONVOLATILE MEMORY DEVICES

(75) Inventors: Yoo-Cheol Shin, Gyeonggi-do (KR); Jung-Dal Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 664 days.

(21) Appl. No.: 11/390,662

(22) Filed: Mar. 28, 2006

(65) Prior Publication Data

US 2006/0226505 A1    Oct. 12, 2006

(30) Foreign Application Priority Data

Apr. 12, 2005    (KR)    ............... 10-2005-0030458

(51) Int. Cl.
    *H01L 27/088* (2006.01)
(52) U.S. Cl. .............. 257/390; 257/E21.179; 438/587
(58) Field of Classification Search .......... 257/390, 257/E21.179; 438/587
    See application file for complete search history.

(56) References Cited

U.S. PATENT DOCUMENTS 6,531,366 B1 * 3/2003 Kouznetsov ............ 438/303
2002/0008278 A1 1/2002 Mori
2002/0137306 A1 * 9/2002 Chen ..................... 438/430
2003/0124793 A1 * 7/2003 Tsuji ..................... 438/241
2003/0203594 A1 * 10/2003 Shimizu et al. ........... 438/424

FOREIGN PATENT DOCUMENTS

| CN | 1289148 A | 3/2001 |
| JP | 2001-168186 | 6/2001 |
| KR | 10-1998-0073685 | 11/1998 |
| KR | 10-2004-0057568 | 7/2004 |

* cited by examiner

*Primary Examiner*—Lex Malsawma
*Assistant Examiner*—Matthew Gordon
(74) *Attorney, Agent, or Firm*—Myers Bigel Sibley & Sajovec

(57) ABSTRACT

Nonvolatile memory devices and methods of fabricating the same are provided. A semiconductor substrate is provided having a cell field region and a high-voltage field region. Device isolation films are provided on the substrate. The device isolation films define active regions of the substrate. A cell gate-insulation film and a cell gate-conductive film are provided on the cell field region of the substrate including the device isolation films. A high-voltage gate-insulation film and a high-voltage gate-conductive film are provided on the high-voltage field region of the substrate including the device isolation films. The device isolation film on the high-voltage field region of the substrate is at least partially recessed to provide a groove therein.

16 Claims, 16 Drawing Sheets

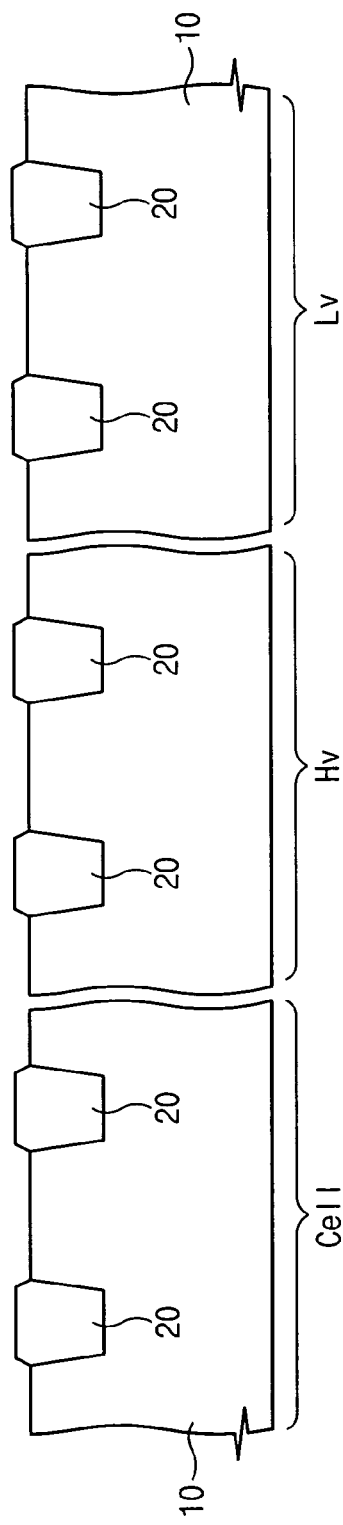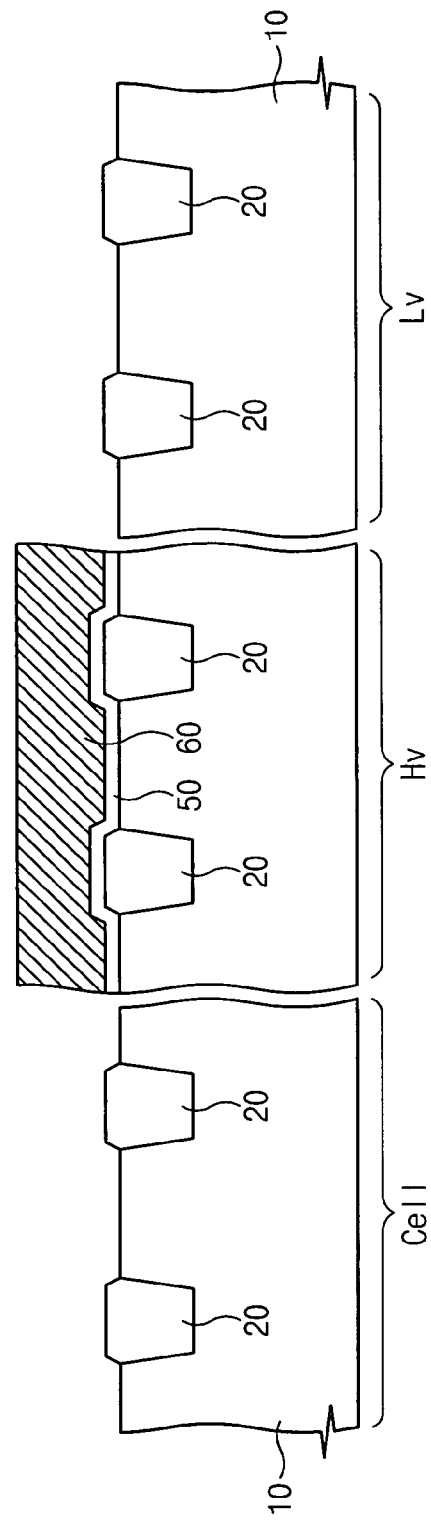

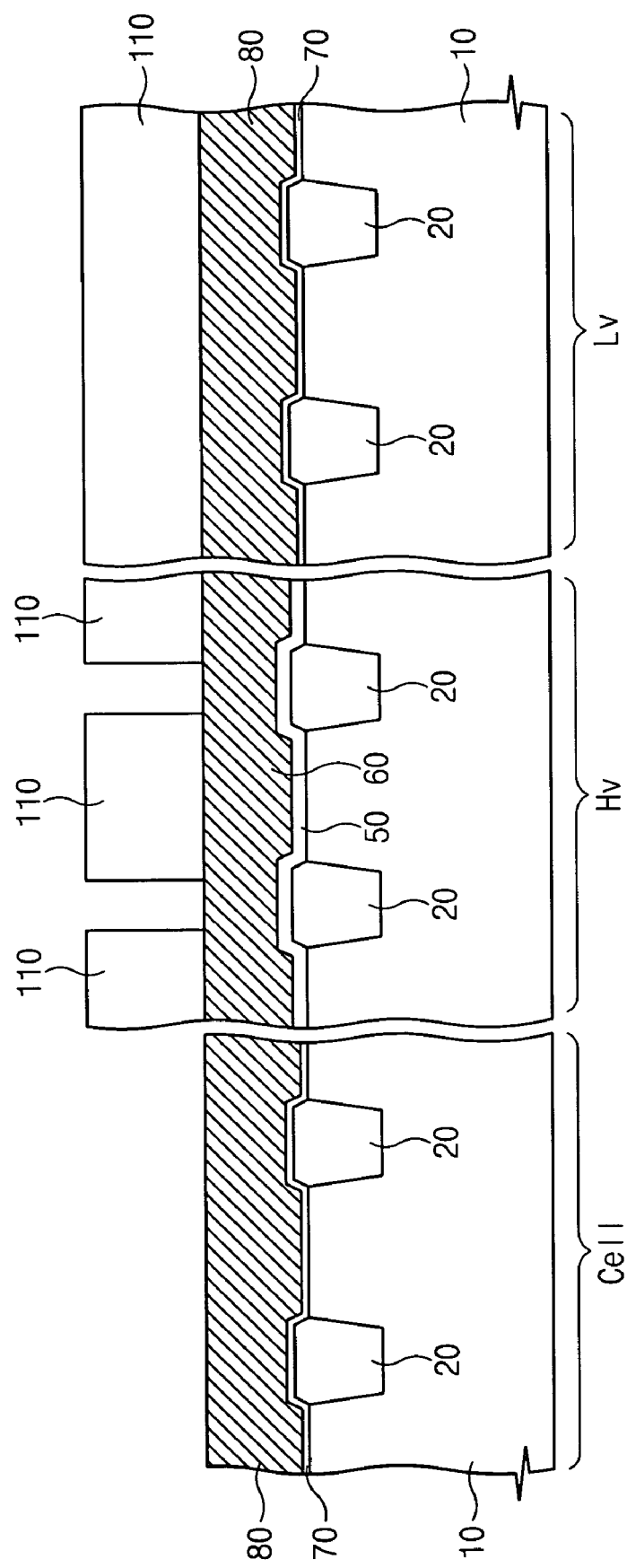

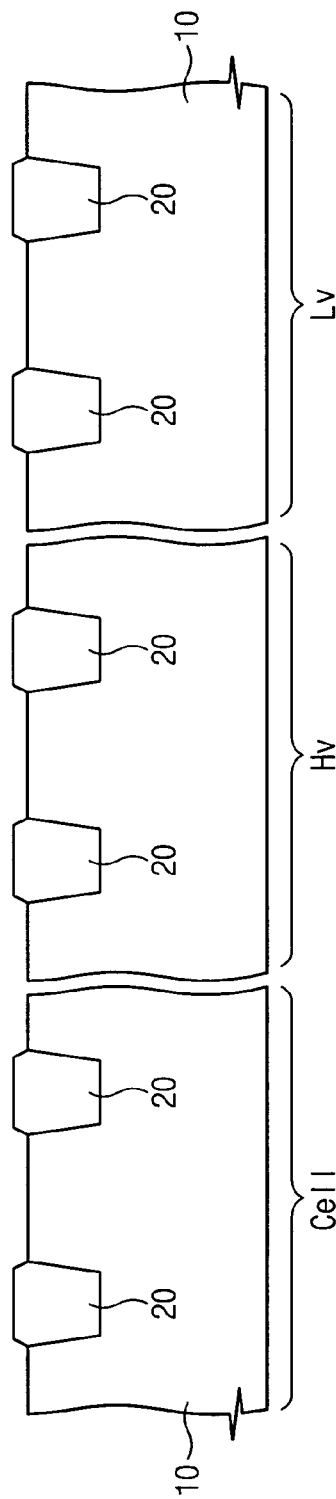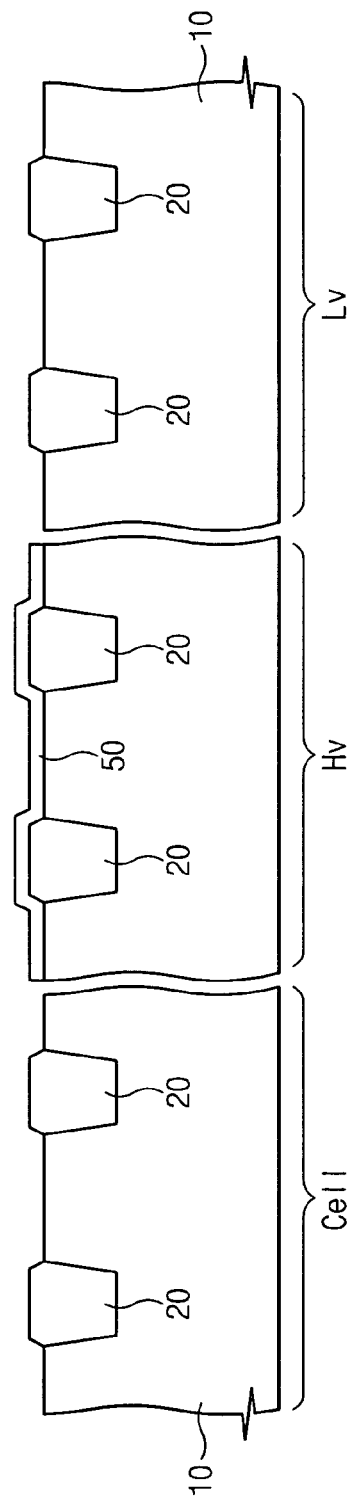

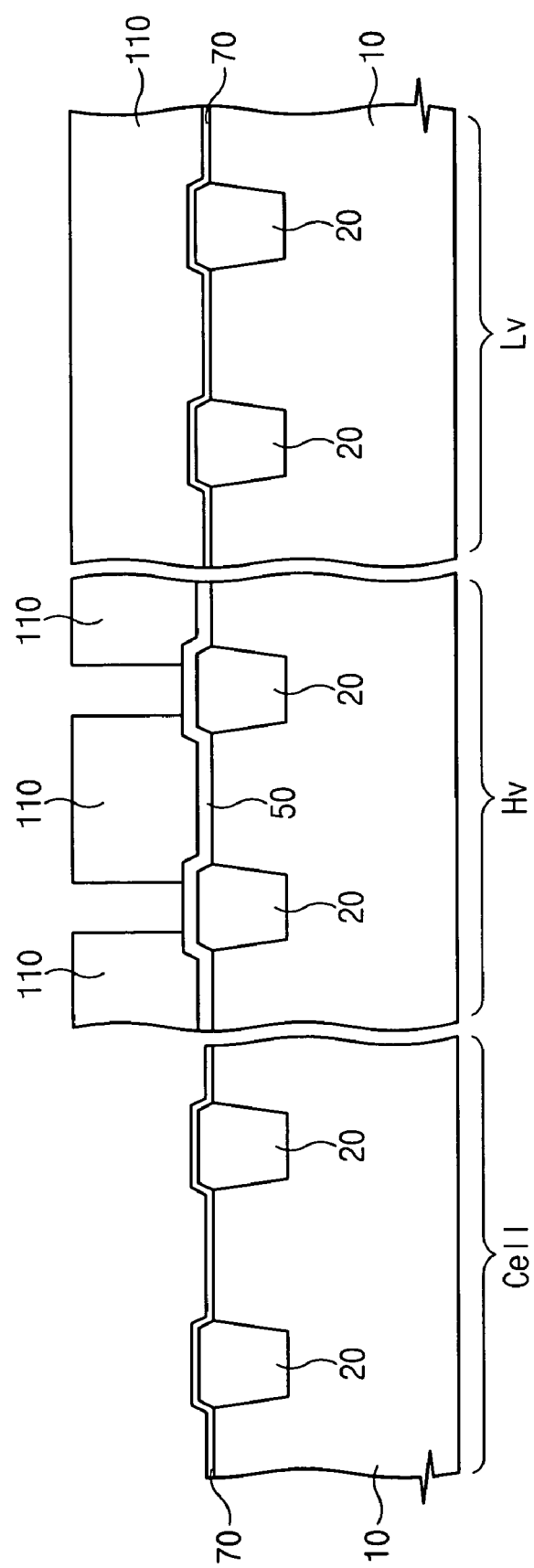

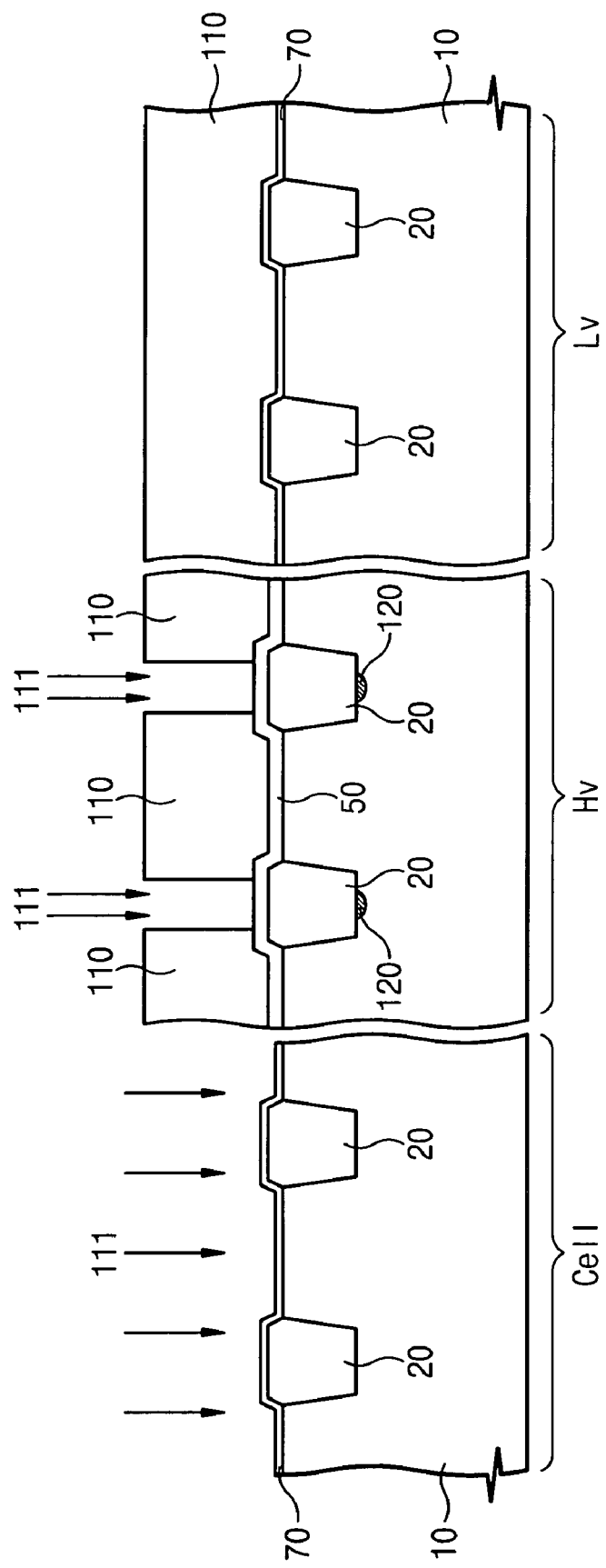

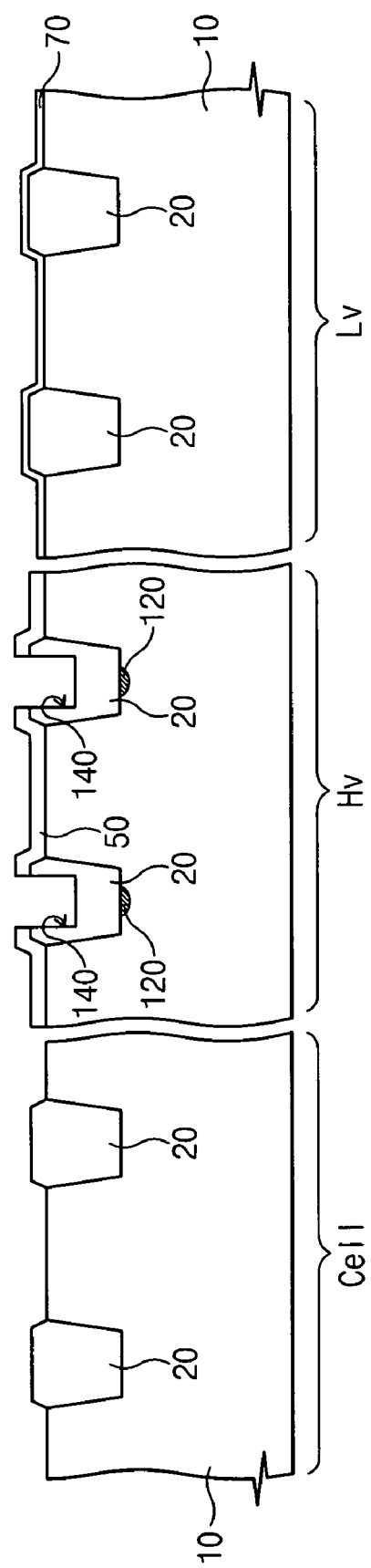

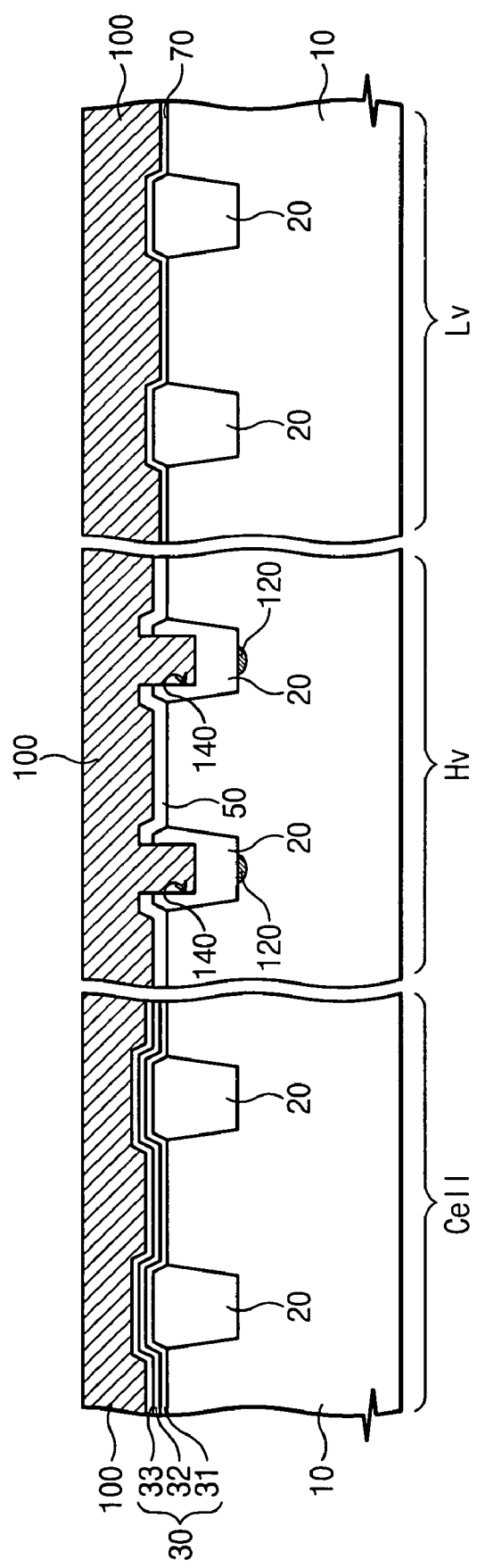

METHODS OF FABRICATING NONVOLATILE MEMORY DEVICES

CLAIM OF PRIORITY

This application is related to and claims priority from Korean Patent Application No. 10-2005-30458 filed on Apr. 12, 2005, in the Korean Intellectual Property Office, the disclosure of which is hereby incorporated herein by reference as if set forth in its entirety.

FIELD OF THE INVENTION

The present invention relates to semiconductor devices and methods of fabricating the same, and more particularly, to nonvolatile memory devices and methods of fabricating the same.

BACKGROUND OF THE INVENTION

Semiconductor memory devices used for storing different types of data are generally classified a volatile and nonvolatile. Volatile memory devices lose data stored therein when the power thereto is interrupted. In contrast, nonvolatile memory devices retain their data even when power thereto is interrupted. Thus, nonvolatile memory devices may be useful for applications, such as mobile phones, that have intermittent access to power supplies, i.e., where the battery may run out before the device can be charged or plugged in.

Types of nonvolatile memory devices may include flash memory devices, ferroelectric memory devices, phase-changeable memory devices, magnetic memory devices, and the like. Flash memory devices may be used to enhance integration because they use unit cells similar to metal oxide semiconductor (MOS) transistors without additional elements for storing information. Flash memory devices may be classified into floating-gate and floating-trap types in accordance with structural features of the memory cell. Floating-gate flash memory devices have a floating gate isolated by an insulation film between a semiconductor substrate and a control gate, into which data is stored by implanting charges. Floating-trap flash memory devices store data by implanting charges into a trap that is formed in a non-conductive charge storage film between a semiconductor substrate and a gate electrode.

Referring to FIG. 1, a cross section illustrating a conventional cell transistor of a floating-trap memory device will be discussed. Referring to FIG. 1, N-type impurities are implanted into regions of a P-type semiconductor substrate 1, forming source and drain regions S and D, respectively. A cell gate-insulation film 3 and a cell gate-conductive film 4 are formed between the source and drain regions S and D, respectively. The cell gate-insulation film 3 includes a tunneling insulation film 3a, a charge storage film 3b, and a blocking insulation film 3c.

There are potential barriers at the interfaces among the semiconductor substrate 1, the tunneling insulation film 3a, the charge storage film 3b, the blocking insulation film 3c, and the cell gate-conductive film 4. In storing data, electrons are accelerated toward the drain region D from the source region S. The accelerated electrons are captured by the charge storage film 3b, after passing through the potential barrier of the tunneling insulation film 3a. In contrast, in erasing data, the electrons captured by the charge storage film 3b are forced to penetrate the tunneling insulation film 3a. In reading data, a threshold voltage of a selected cell transistor is measured. The threshold voltage is variable in accordance with whether the electrons are being captured or not.

Such a flash memory device has a peripheral circuit for driving memory cells. The peripheral circuit may include low-voltage transistors operable in a read mode and high-voltage transistors operable in program/erase modes. FIG. 2 is a cross section illustrating a structure of the conventional floating-trap memory device including a peripheral circuit.

Referring to FIG. 2, a cell field region Cell, a high-voltage field region Hv, and a low-voltage field region Lv represent regions where cell transistors, high-voltage transistors, and low-voltage transistors are formed, respectively. As illustrated in FIG. 2, device isolation films 2 are formed in the semiconductor substrate 1 to define active regions therein. The cell gate-insulation film 3 and the cell gate-conductive film 4 are formed in the cell field region Cell; a high-voltage gate-insulation film 5 and a high-voltage gate-conductive film 6 are formed in the high-voltage field region Hv; and a low-voltage gate-insulation film 7 and a low-voltage gate-conductive film 8 are formed in the low-voltage field region Lv. The cell gate-insulation film 3 includes a tunneling insulation film 3a, a charge storage film 3b, and a blocking insulation film 3c. The high-voltage gate-insulation film 5 and the low-voltage gate-insulation film 7 include a single layer. The high-voltage gate-insulation film 5 is thicker than the low-voltage gate-insulation film 7 in order to enhance a characteristic of voltage endurance because the high-voltage transistors operate with a voltage boosted up from an external source voltage. Channel-stopping regions 9, into which impurities have been implanted, are formed under the device isolation films 2 of the high-voltage field region Hv. The channel-stopping regions 9 are provided for the purpose of maintaining isolation conditions between transistors, considering the fact that high-voltage differences are generated between adjacent transistors of the high-voltage field region Hv.

Conventional flash memory devices may have problems in conjunction with manufacturing processes. For example, processing steps in the fabrication of the flash memory device illustrated in FIG. 2 may be complicated due to the fact that the gate-insulation films 3, 5, and 7 have different thicknesses and the structures are used in the cell field region Cell, the low-voltage field region Lv, and the high-voltage field region Hv. For example, the high-voltage gate-insulation film 5 is formed on the semiconductor substrate 1; the high-voltage gate-insulation film 5 is removed from the cell and low-voltage field regions while blocking the high-voltage field region; the low-voltage gate-insulation film 7 is formed in the cell and low-voltage field regions; the low-voltage gate-insulation film 7 is removed from the cell field region while blocking the low and high-voltage field regions; and the cell gate-insulation film 3 is removed from the high and low-voltage field regions after depositing the cell gate-insulation film 3 on the semiconductor substrate 1. Furthermore, impurities are implanted for the channel-stopping regions 9 or for the threshold voltage control. The impurities for the channel-stopping regions 9 are implanted through the device isolation films 2 in the high-voltage field region Hv, causing the fabrication process to be complicated.

Furthermore, conventional flash memory devices like the device of FIG. 2 fabricated using conventional methods, may be regarded as being insufficient or having deficient operational characteristics. For example, in highly integrated devices a distance between the device isolation films 2, which corresponds to a channel width of a transistor in FIG. 2, may become narrower. The reduction of channel width may cause the amount of current to decrease during an operation of the transistor. Moreover, as a size of the device is decreased, a channel length between the source and drain regions S and D is also gradually decreased, which may cause a short channel effect therein.

SUMMARY OF THE INVENTION

Some embodiments of the present invention provide non-volatile memory devices and methods of fabricating the same. A semiconductor substrate is provided having a cell field region and a high-voltage field region. Device isolation films are provided on the substrate. The device isolation films define active regions of the substrate. A cell gate-insulation film and a cell gate-conductive film are provided on the cell field region of the substrate including the device isolation films. A high-voltage gate-insulation film and a high-voltage gate-conductive film are provided on the high-voltage field region of the substrate including the device isolation films. The device isolation film on the high-voltage field region of the substrate is at least partially recessed to provide a groove therein.

In further embodiments of the present invention, a depth of the groove may be larger than a thickness of the high-voltage gate-insulation film. An upper surface of the device isolation film in the cell field region may be recessed. The cell gate-insulation film may include a tunneling insulation film on the substrate, a charge storage film on the tunneling insulating film and a blocking insulation film on the charge storage film. A common gate-conductive film may be provided on the high-voltage gate-conductive film and the cell gate-conductive film.

In still further embodiments of the present invention, a thickness of the high-voltage gate-insulation film is smaller than a distance between an edge of the device isolation film and the groove. The high-voltage gate-conductive film may include an opening on the groove and the common gate-conductive film may be provided in the groove and opening. The cell gate-insulation film may be formed between a sidewall of the groove and the opening, and the common gate-conductive film.

BRIEF DESCRIPTION OF THE DRAWINGS

FIGS. 3A through 3H are cross sections illustrating processing steps in the fabrication of nonvolatile memory devices in accordance with some embodiments of the present invention.

FIGS. 4A through 4G are cross sections illustrating processing steps in the fabrication of nonvolatile memory devices in accordance with further embodiments of the present invention.

DETAILED DESCRIPTION OF EMBODIMENTS OF THE PRESENT INVENTION

Figure 1:
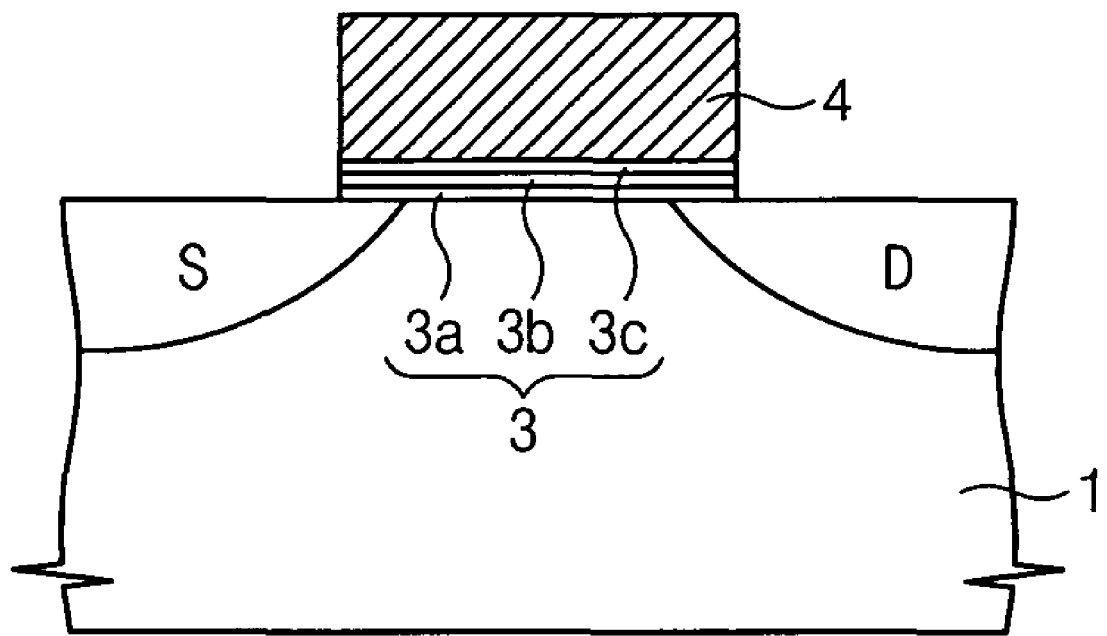
FIG. 1 is a cross section illustrating a cell transistor of a conventional floating-trap memory device.
Figure 2:
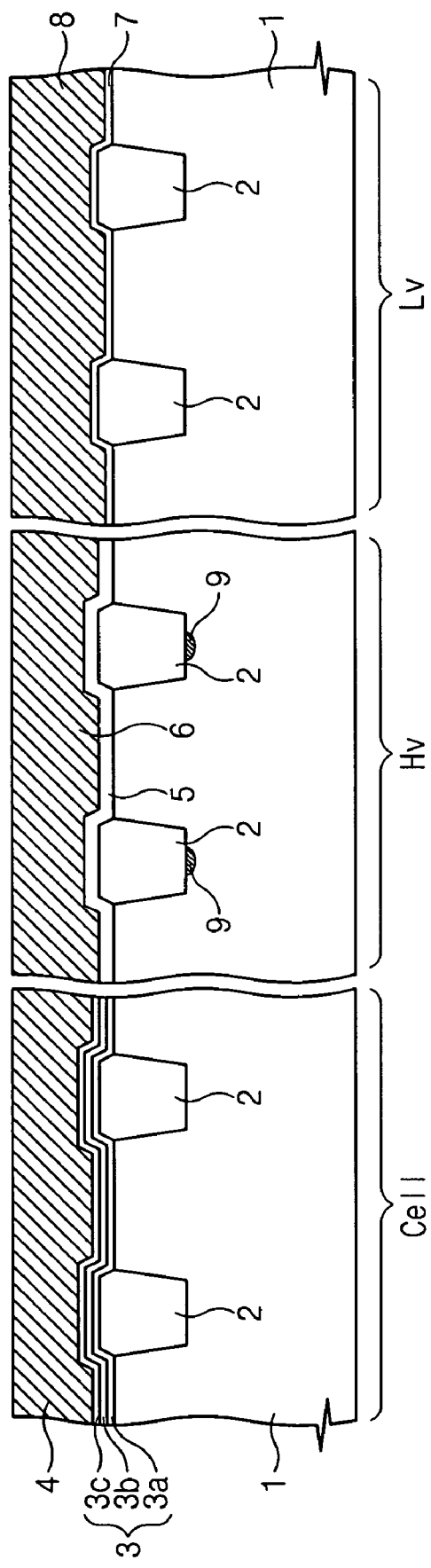
FIG. 2 is a cross section illustrating unit cells of the conventional floating-trap memory device including a peripheral circuit.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3C:
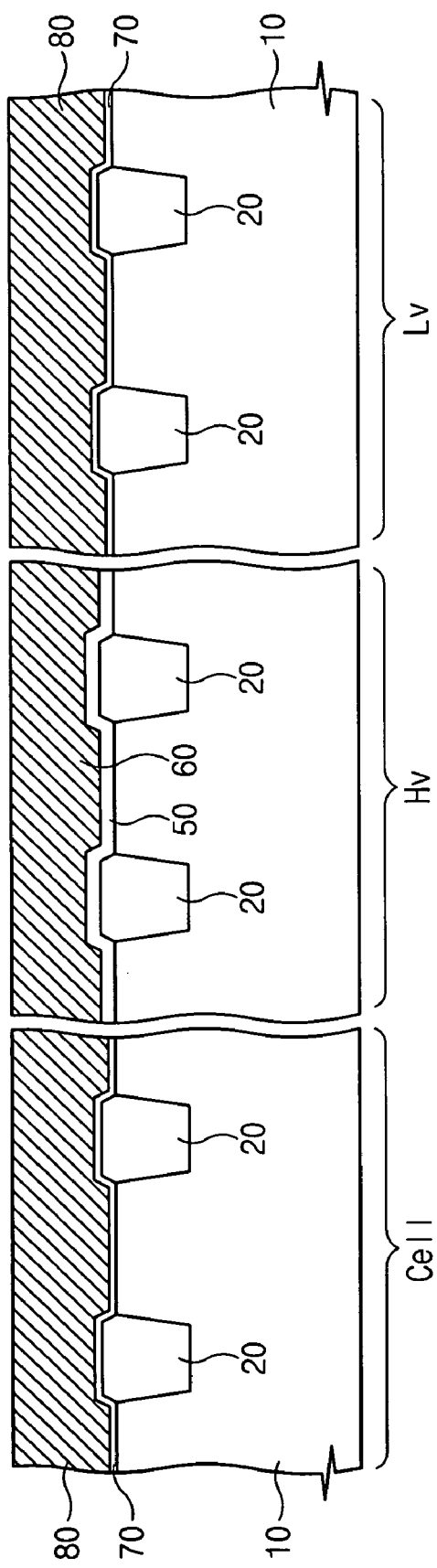

Referring first to FIGS. 3A through 3H, cross sections illustrating processing steps in the fabrication of nonvolatile memory devices according to some embodiments of the present invention will be discussed. As illustrated in FIG. 3A, device isolation films 20 are formed to define active regions in a semiconductor substrate 10. As illustrated, the substrate has a cell field region Cell, a high-voltage field region Hv, and a low-voltage field region Lv therein. Cell transistors are formed in the cell field region Cell and high and low-voltage transistors are formed in the high and low-voltage field regions. The device isolation films 20 may be completed using, for example, a trench isolation technique. In particular, after forming trenches in the substrate 10 using a photolithography process, oxide films may be provided in the trenches using a high-density plasma deposition technique to form the device isolation films 20.

Referring now to FIG. 3B, high-voltage gate-insulation film 50 and high-voltage conductive film 60 are formed on the high-voltage region Hv of the semiconductor substrate 10. The high-voltage gate-insulation film 50 may include a silicon oxide film and may be formed by, for example, thermally oxidizing the semiconductor substrate 10. The high-voltage gate-conductive film 60 may include a polysilicon film containing a high-concentration of impurities, which may be formed by, for example, chemical vapor deposition. There are various ways to form the high-voltage gate-insulation film 50 and the high-voltage gate conductive film 60 on the high-voltage field region Hv. For example, the high-voltage gate-insulation film 50 and the high-voltage conductive film 60 may be formed on the high-voltage field region Hv, the cell and low-voltage field regions Cell and Lv. A mask may be formed on the high-voltage gate-insulation film 50 and the high-voltage conductive film 60, such as a mask on the high-voltage field region of the substrate. The films 50 and 60 may be removed from the cell and low-voltage field regions according to the mask.

Referring now to FIG. 3C, a low-voltage gate-insulation film 70 and a low-voltage conductive film 80 are formed on the cell field region Cell and low-voltage field region Lv of the semiconductor substrate 10. The low-voltage gate-insulation film 70 and the low-voltage conductive film 80 can be formed in the cell and low-voltage field regions by conducting the thermal oxidation and CVD when the high-voltage field region Hv is covered by the mask used to remove films 50 and 60 from the cell and low-voltage field regions of the substrate.

Referring now to FIG. 3D, a mask 110 is formed on the low-voltage conductive film 80 on the low-voltage field region of the substrate and the high-voltage gate conductive film 60 in the high-voltage field region of the substrate. The mask 110 on the high-voltage field region of the substrate partially reveals the isolation films 20 in the high-voltage field region Hv. In some embodiments of the present invention, the mask 110 may be formed by, for example, depositing and patterning a photoresist film. Furthermore, the mask 110 may be a hard mask formed by, for example, patterning a silicon nitride film using the photoresist film.

Figure 3E:
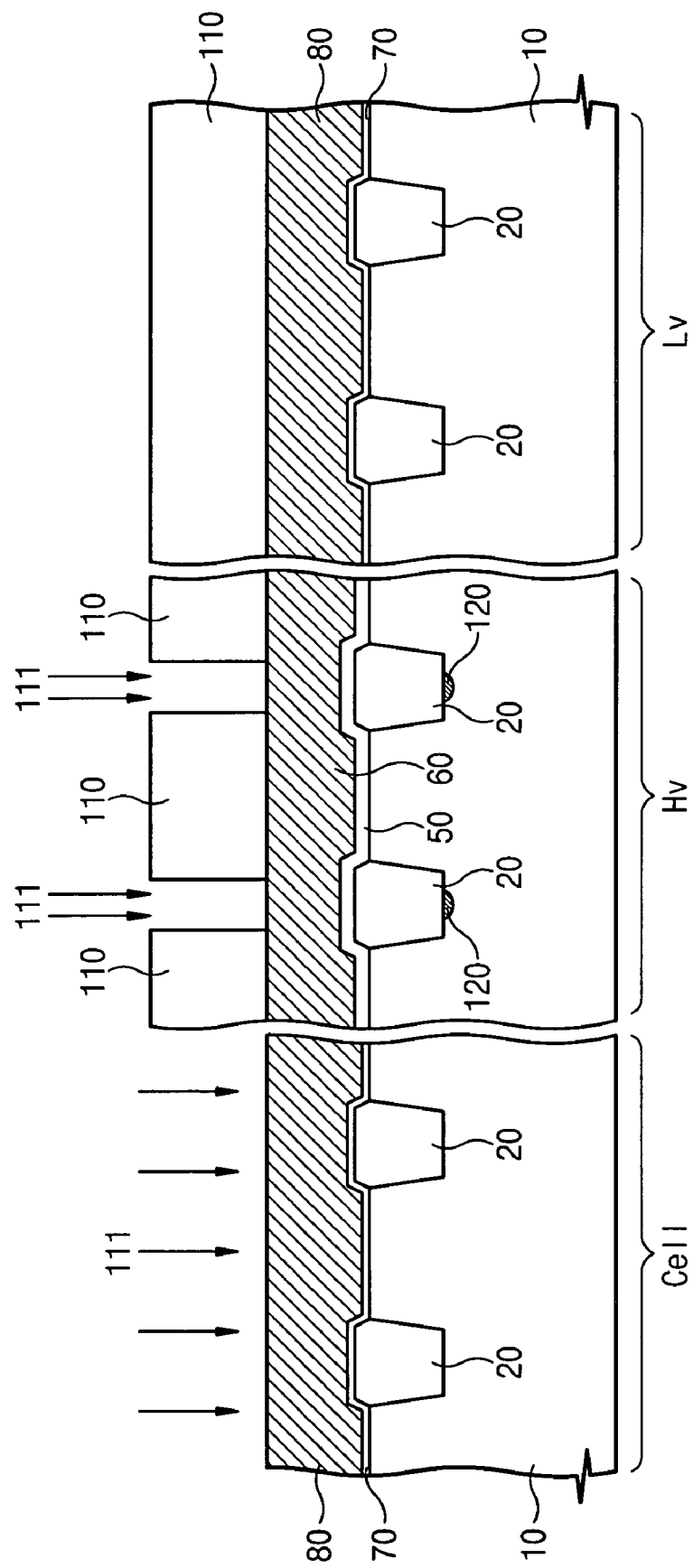

Referring now to FIG. 3E, impurities 111 are implanted into the low-voltage conductive film 80 on the cell field region of the substrate and in the high-voltage gate conductive film 60 in the high-voltage region of the substrate 10 according to the mask 110. The implanted impurity regions may settle channel-stopping regions under the device isolation films 20 in the high-voltage field region Hv and may adjust threshold voltages in the cell field region Cell.

The channel-stopping regions 120 formed by implanting impurities under the device isolation films 20 are present due to the high-voltages applied to the high-voltage transistors. In some embodiments of the present invention, the impurities may be implanted into the target regions for the channel stopping function using the mask 110 that partially reveals the device isolation films 20 in the high-voltage field region of the substrate. Furthermore, the mask 110 may also be used to implant impurities into the cell field region Cell for the threshold voltage control. The impurities for the threshold voltage control are implanted into the channel regions of the cell transistors, adjusting threshold voltages for the cell transistors. The depth of the implanted regions may be different for the threshold voltage control and the channel stopping, which may be controlled by ion implantation energy. For example, when the impurities are being implanted for adjusting the threshold voltages, the energy may be controlled to make the impurities set on the surface of the semiconductor substrate 10. As the device isolation films 20 are partially disclosed by the mask 110, the impurities for the threshold voltage control may be implanted into the device isolation films 20 in the high-voltage field region Hv. However, such impurities on the surfaces of the device isolation films 20 in the high-voltage field region Hv may not influence operational characteristics of the high-voltage transistors, so it may not be unnecessary to protect the device isolation films 20 using an additional mask in the high-voltage field region Hv according to some embodiments of the present invention.

The mask 110 may also be used to remove the low-voltage gate-insulation film 70 and the low-voltage gate-conductive film 80 from the cell field region Cell and the high-voltage field region, as described hereinafter, as well as to implant the impurities for the channel-stopping regions 120 and the threshold voltage control. In other words, according to some embodiments of the present invention, the mask 110 may be used multiple times, which may simply the fabrication process overall.

Figure 3F:
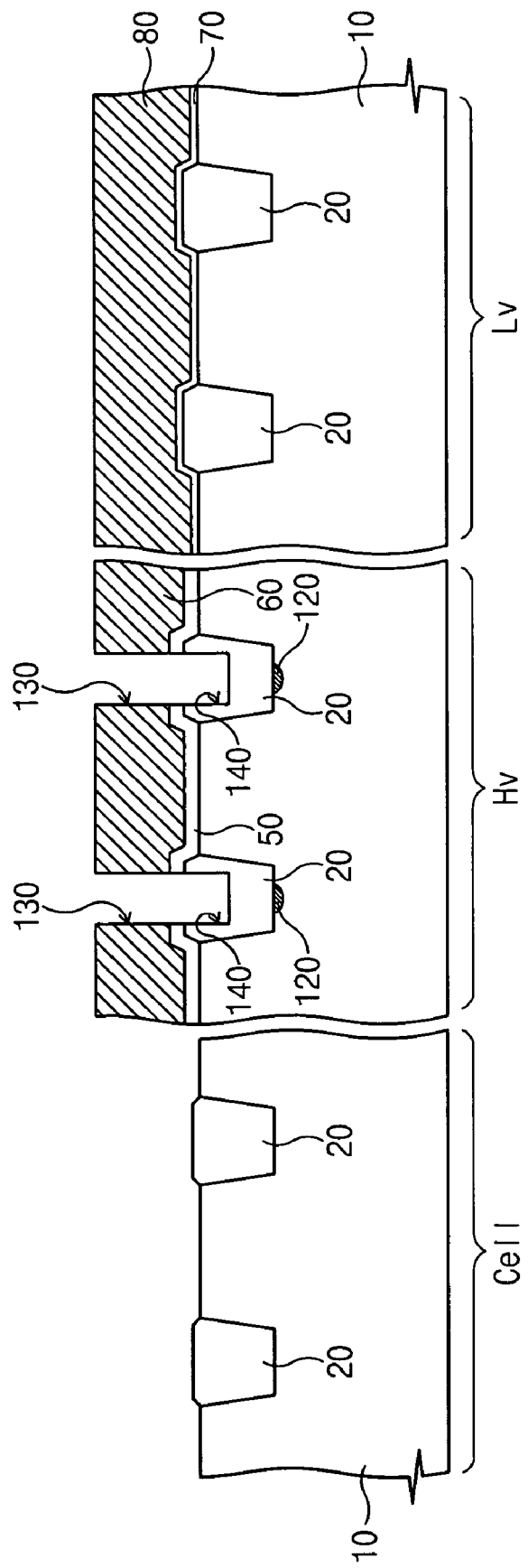

Referring to now to FIG. 3F, the gate-conductive films 60 and 80 and the gate-insulation films 50 and 70 are removed. In particular, the low-voltage gate-conductive film 80 and the low-voltage gate-insulation film 70 are removed from the cell field region Cell while the high-voltage gate-conductive film 60 and the high-voltage gate-insulation film 50 are removed from portions of the high-voltage field region Hv. As illustrated, openings 130 are formed on the high-voltage field region while removing the high-voltage gate-conductive film 50 therefrom. In some embodiments of the present invention, the high-voltage gate-insulation film 50 is formed using thermal oxidation and may not be formed on the device isolation films 20.

In some embodiments of the present invention, separate removing steps may be provided for the gate-conductive films 60 and 80 and the gate-insulation films 50 and 80 in the processing order, i.e., to carry out the former steps of ion implantation after removing the gate-conductive films 60 and 80, but before removing the gate-insulation films 50 and 70. Ion implantation after removing the gate-conductive films 60 and 80 may be advantageous because the impurities for channel stopping may be provided just to maintain the separation among the device isolation films 20, and there may be no need to precisely control the ion implantation regions. Otherwise, the impurities for the threshold voltage control may be provided to directly adjust the threshold voltages of the cell field region, so they should be implanted into the channel regions on the surface of the semiconductor substrate 10. Therefore, if the gate-conductive films 60 and 80 have been removed, it may be relatively easy to implant the impurities because the gate-insulation film 70 may only be present on an upper surface of the semiconductor substrate 10. Furthermore, without the gate-conductive films 60 and 80, as the depth of the ion implantation is reduced by the thickness of the gate-conductive films 60 and 80, it may be possible to reduce the energy for the ion implantation.

Referring again to FIG. 3F, after removing the gate-insulation films 50 and 70, the device isolation films 20 may be recessed by, for example, increasing an etch time during the removal of the gate-insulation films 50 and 70. As illustrated, the device isolation films 20 in the cell field region Cell are not covered and in the high-voltage field region Hv, the device isolation films 20 are partially covered by the gate-conductive films 60 and 80. Thus, grooves 130 are formed in regions of the device isolation films 20 of the high-voltage field region of the substrate. In some embodiments of the present invention, the recessing step increases channel widths of the high-voltage transistors, which may provide improved operational characteristics thereof, as will be discussed further herein. According to some embodiments of the present invention, implanting the impurities, removing the gate conductive and insulation films, 60, 80, 50, and 70, and recessing the device isolation films 20 may be performed in sequence using a single mask 110 illustrated in FIG. 3D, which may simplify the overall fabrication process.

Figure 3G:
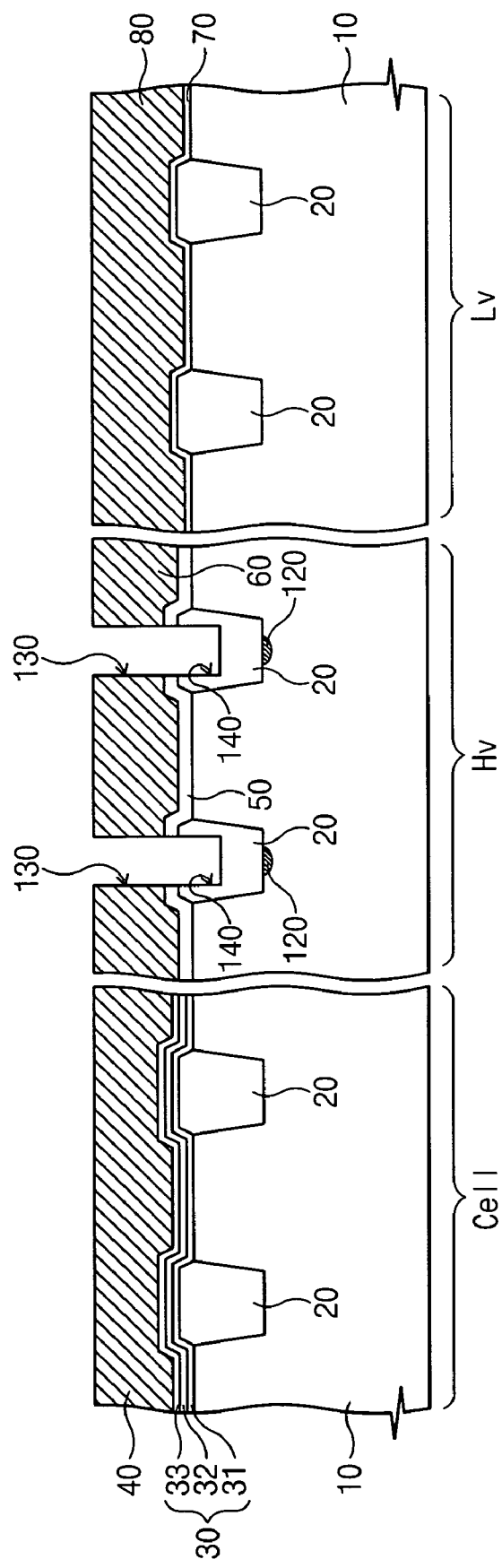

Referring now to FIG. 3G, a cell gate-insulation film 30 and a cell gate-conductive film 40 are formed in the cell field region Cell. The cell gate-insulation film 30 includes a tunneling insulation film 31, a charge storage film 32, and a blocking insulation film 33. The tunneling insulation film 31 is a film through which electrons flow during a programming or an erasing mode of the memory device. The tunneling insulation film 31 may include, for example, a thermal oxide film ($SiO_2$), which may be formed by oxidizing the semiconductor substrate 10. The charge storage film 32 is provided to trap electrons by tunneling. The charge storage film 32 may include, for example, a silicon nitride film ($Si_3N_4$) that has high trapping density and electronic affinity larger than those of the tunneling insulation film 31 and the blocking insulation film 33. The blocking insulation film 33 is provided to isolate the gate from the charge storage film 32. The blocking insulation film 33 may include, for example, a silicon oxide film or a high-dielectric or metallic film having a high dielectric constant and a large energy bandgap. The cell gate-conductive film 40 may include polysilicon stacked on the cell gate-insulation film 30.

After forming the cell gate-insulation film 30 and the cell gate-conductive film 40 on the semiconductor substrate 10, a mask is formed on the films 30 and 40 on the cell field region Cell. The cell gate-insulation film 30 and the cell-conductive film 40 are removed from the low and high-voltage field regions Lv and Hv according to the mask. Thus, the cell gate-insulation film 30 and the cell gate-conductive film 40 remain in the cell field region Cell. It will be understood that the cell gate-insulation film 30 may partially remain in the grooves 140 and on sidewalls of the openings 130 in the high-voltage field region Hv without departing from the scope of the present invention.

Figure 3H:
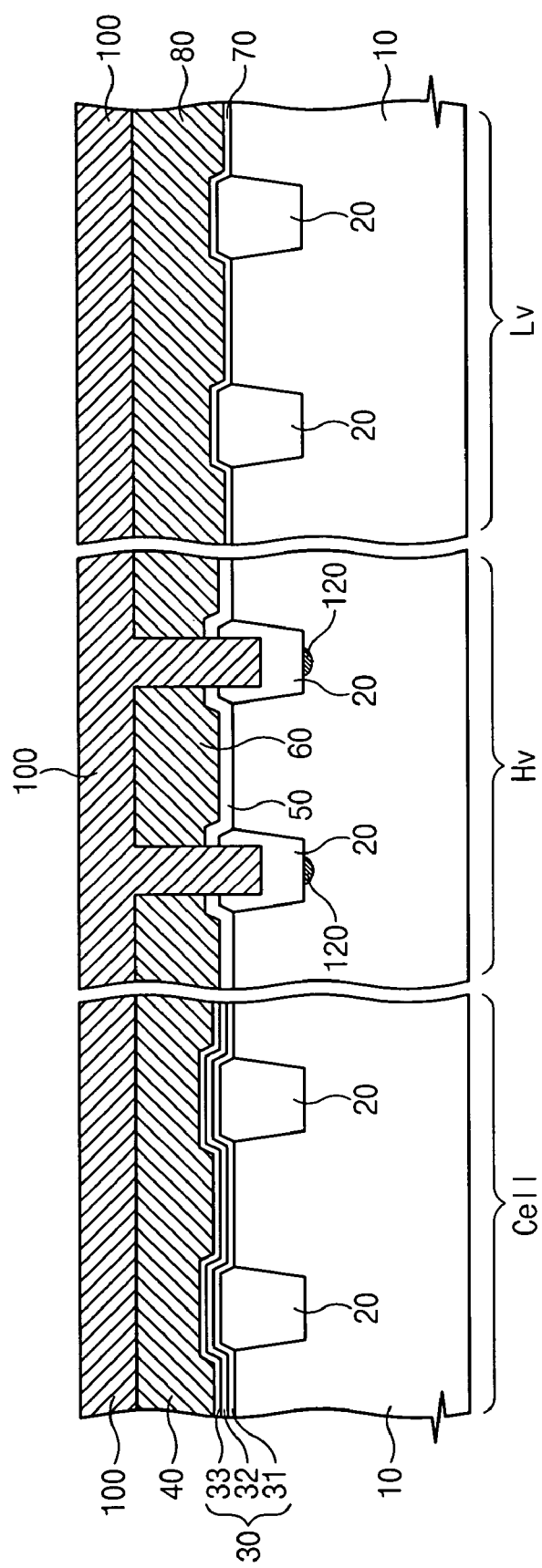

Referring now to FIG. 3H, a common gate-conductive film 100 is deposited on the semiconductor substrate 10. Thus, as illustrated in FIG. 3H, the cell field region Cell includes the cell gate-insulation film 30, the cell gate-conductive film 40, and the common gate-conductive film 100. The low-voltage field region Lv includes the low-voltage gate-insulation film 70, the low-voltage gate-conductive film 80, and the common gate-conductive film 100. The high-voltage field region Hv includes the high-voltage gate-insulation film 50, the high-voltage gate-conductive film 60, and the common gate-conductive film 100. Specifically, in the high-voltage field region Hv, the grooves 140 and the openings 130 formed on the device isolation films 20 may include the common gate-conductive film 100.

After forming the gate-insulation films, 30, 50, and 70, and the gate-conductive films 40, 60, 80, and 100, processing steps are carried out to pattern the films and to implant impurities. Completing the processing steps, the source and drain regions and the gate electrode are formed as will be understood by those having skill in the art.

The orders of forming the gate-insulation films, 30, 40, and 70, and the gate-conductive films, 40, 60, 80, and 100 may be varied in consideration with the efficiency of the fabrication process. Furthermore, as the conditions with the threshold voltage control and channel stopping regions are not always necessary for the cell and high-voltage field regions, the processing steps of the invention may be adaptable thereto without differentiation among the cell, high-voltage, and low-voltage field regions.

Furthermore, in the processing steps in the fabrication of memory devices discussed above with respect to FIGS. 3A through 3H, the gate-conductive films, 40, 60, 80, and 100, are formed, for example, deposited, on the gate-insulation films 30, 40, and 70. The gate-insulation films, 30, 40, and 70, are formed separately in the cell, high-voltage, and low-voltage field regions because they are different from each other in material and/or thickness. However, the gate-conductive films, 40, 60, 80, and 100, may be formed at the same time because they are not very different from each other. In some embodiments of the present invention, the cell gate-conductive film 40, the high-voltage gate-conductive film 60, and the low-voltage gate-conductive film 80 may be omitted, which will be discussed further below. In particular, some embodiments of the present invention having only the common gate-conductive film 100 will be discussed.

Figure 4C:
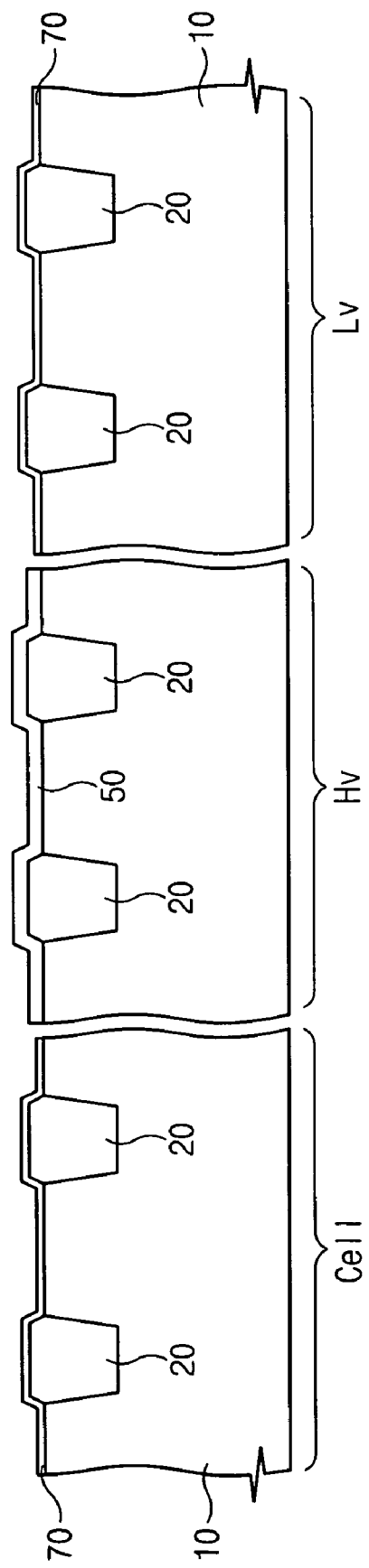

Referring now to FIGS. 4A through 4G, cross sections illustrating processing steps in the fabrication of memory devices according to further embodiments of the present invention will be discussed. Referring to first to FIG. 4A, device isolation films 20 define active regions in the semiconductor substrate 10. The active regions are defined using, for example, a trench isolation technique. The substrate has a cell field region Cell, a high-voltage field region Hv, and a low-voltage field region Lv therein.

Referring now to FIG. 4B, a high-voltage gate-insulation film 50 is formed, for example, deposited, on the high-voltage region Hv of the semiconductor substrate 10. In particular, after forming the high-voltage gate-insulation film 50 on the semiconductor substrate 10, a mask may be formed such that the high-voltage gate-insulation film 50 may be removed from the cell and low-voltage field regions.

Referring now to FIG. 4C, a low-voltage gate-insulation film 70 is formed on the cell and low-voltage field regions Cell and Lv of the semiconductor substrate 10. The mask used to remove the excess high-voltage gate-insulation film 50 may be used as the mask for the formation of the low-voltage gate-insulation film 70. Thus, the low-voltage gate-insulation film 70 can be formed only in the cell and low-voltage field regions using, for example, a thermal oxidation process.

Referring to FIG. 4D, a mask 110 is formed through which the device isolation films 20 may be at least partially revealed in the high-voltage field region Hv and the cell field region Cell. The mask 110 may be formed by, for example, depositing and patterning a photoresist film or patterning a silicon nitride film using the photoresist film.

Referring now to FIG. 4E, impurities 111 are implanted into the substrate according to the mask 110. These impurities 111a may be provided for settling channel-stopping regions under the device isolation films 20 in the high-voltage field region Hv, or for adjusting threshold voltages in the cell field region Cell. The impurities for the threshold voltage control may be implanted into the channel regions on the surface of the semiconductor substrate 10. In the cell field region Cell, it may be relatively easy to implant the impurities because the cell gate-insulation film 30 is only present from the semiconductor substrate 10 to the channel regions.

Referring now to FIG. 4F, the gate-insulation film 50, 70 is removed according to the mask 110. In particular, the low-voltage gate-insulation film 70 is removed from the cell field region Cell and the high-voltage gate-insulation film 50 is partially removed from the high-voltage field region Hv as illustrated. If the high-voltage gate-insulation film 50 is formed using, for example, thermal oxidation, it may not be formed on the device isolation films 20. Furthermore, the recessing step is further carried out to form grooves 140 on the device isolation films 20 in the high-voltage field region Hv. The device isolation films 20 of the cell field region Cell are etched as a whole. This recessing step may increase channel widths of the high-voltage transistors, which may provide improved operational characteristics thereof, as will be discussed further herein.

Referring now to FIG. 4G, the cell gate-insulation film 30 is formed in the cell field region Cell. The cell gate-insulation film 30 includes a tunneling insulation film 31, a charge storage film 32, and a blocking insulation film 33. In order to arrange the cell gate-insulation film 30 in the cell field region Cell, after forming the cell gate-insulation film 30 on the semiconductor substrate 10, the cell gate-insulation film 30 is removed from the low and high-voltage field regions Lv and Hv using a mask on the cell field region Cell.

A common gate-conductive film 100 is formed, for example, deposited, on the semiconductor substrate 10. Thus, the cell field region Cell includes the cell gate-insulation film 30 and the common gate-conductive film 100. The low-voltage field region Lv includes the low-voltage gate-insulation film 70 and the common gate-conductive film 100. The high-voltage field region Hv includes the high-voltage gate-insulation film 50 and the common gate-conductive film 100. Specifically, in the high-voltage field region Hv, the grooves 140 formed on the device isolation films 20 include the common gate-conductive film 100.

Thereafter, processing steps are carried out to pattern the gate-insulation films, 30, 50, and 70, the common gate-conductive film 100 and to implant impurities. Completing the processing steps, the source and drain regions and the gate electrode are formed therein as will be understood by those having skill in the art.

Nonvolatile memory devices illustrated in FIGS. 3H and 4G will now be discussed. The memory device structure illustrated in FIG. 3H is substantially similar to that of FIG. 4G, except the memory device of FIG. 3H includes the gate-conductive films 40, 60, and 80. Although the memory device of FIG. 4G, i.e., not including the gate-conductive films 40, 60 and 80, will be discussed further herein, it will be understood that nonvolatile memory devices may be fabricated using processing steps discussed above with respect to FIGS. 3A through 3H, FIGS. 4A through 4G or a combination thereof without departing from the scope of the present invention.

Referring again to FIG. 4G, the device isolation films 20 are formed on the semiconductor substrate 10 sectioned into the cell field region Cell, the high-voltage field region Hv, and the low-voltage Lv, defining the active regions. The cell gate-insulation film 30, the high-voltage gate-insulation film 50, and the low-voltage gate-insulation film 70 are formed on the active regions. The common gate-conductive film 100 is formed on the gate-insulation films 30, 50, and 70. Upper surfaces of the device isolation films 20 are partially recessed to form the grooves 140 thereon. The common gate-conductive film 100 is provided in the grooves 140.

Figure 5:
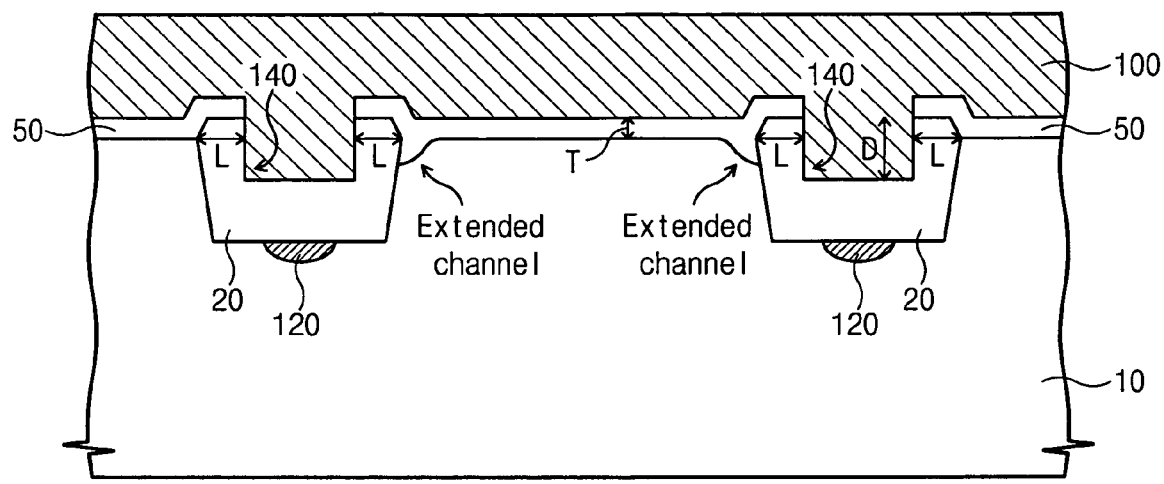
FIG. 5 is a cross section illustrating aspects of nonvolatile memory devices according to some embodiments of the present invention.

Referring now to FIG. 5, a cross section enlarging the high-voltage field region Hv shown in FIG. 4G will be discussed. As illustrated in FIG. 5, the space between the device isolation films 20 corresponds to a channel width of the high-voltage transistor, being defined between source and drain regions (not shown). Here, it can be seen that the channel width extends to the depth of the groove 140 in addition to the interval between the device isolation films 20 so that the common gate-conductive film 100 is provided on both sidewalls of the channel width by the groove 140. Thus, the amount of current flowing along the channel may be increased. Furthermore, as the channel of the high-voltage transistor is surrounded by three sides of the common gate-conductive film 100, it may be possible to control the channel all around by the gate. Accordingly, it may be possible to reduce or overcome problems, such as a short channel effect and the like.

In some embodiments of the present invention, the depth D of the grooves 140 may be larger than the thickness T of the high-voltage gate-insulation film 50. This arrangement may arise from the fact that a bottom surface of the groove 140 is at least lower than a bottom surface of the high-voltage gate-insulation film 50 so as to make the common gate-conductive film 100 cover both sides of the channel, because the channel is settled under the high-voltage gate-insulation film 50. Furthermore, the groove 140 may not be close to an edge of the device isolation film 20. The device isolation film 20 may also function as the high-voltage gate-insulation film 50 around the groove 140, i.e., at the region reaching the groove 140 from the edge thereof. Therefore, in some embodiments of the present invention, the distance L from the edge of the device isolation film 20 to the groove 140 may be larger at least than a thickness of the high-voltage gate-insulation film 50 in order to offer endurance against a high-voltage.

As is clear from the cell field region Cell illustrated in FIG. 4G, the device isolation films 20 of the cell field region Cell are also recessed in parts. These recesses in the device isolation films 20 in the cell field region are generated while forming the grooves 140 in the high-voltage field region Hv. Although not shown in FIG. 4G, the cell gate-insulation film 30 may be further formed on the sidewalls of the grooves 140 because the cell gate-insulation film 40 may remain on the sidewalls of the grooves 140 after being removed from the grooves 140 that have been filled with it.

In the structure of the nonvolatile memory device with reference to FIGS. 4G and 5, the grooves are formed in the high-voltage field region. However, these grooves may be also applicable to the low-voltage field region or the cell field region as is effective in the high-voltage field region.

As discussed above, processing steps in the fabrication of nonvolatile memory device may be simplified according to some embodiments of the present invention. Moreover, channel widths of transistors operating in the cell, high-voltage, and low-voltage field regions may be extended, which may increase the amount of operating current in the transistors and overcome short channel effects caused by high integration density.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating a nonvolatile memory device, the method comprising:
    forming device isolation films on a semiconductor substrate having a cell field region, a high-voltage field region, and a low-voltage field region;
    forming a high-voltage gate-insulation film and a high-voltage gate-conductive film on the high-voltage field region;
    forming a low-voltage gate-insulation film and a low-voltage gate-conductive film both in the cell field region and low-voltage field region of the substrate;
    forming a first mask on the substrate, wherein the first mask exposes an entire top surface of the low-voltage gate-conductive film in the cell field region, and exposes a top surface of the high-voltage gate-conductive film to reveal the device isolation films in the high-voltage field region, and covers an entire top surface of the low-voltage gate conductive film in the low-voltage field region;
    implanting impurities into substrate according to the mask;
    removing all the low-voltage gate-insulation film and all the low-voltage gate-conductive film in the cell field region, the high-voltage gate-insulation film, the high-voltage gate-conductive film and a portion of the device isolation films in the high-voltage field region according to the first mask; and
    after the implanting, forming a cell gate-insulation film and a cell gate-conductive film in the cell field region, wherein the cell gate-insulation film, the low-voltage gate-insulation film and the high-voltage gate-insulation film are different materials or have different thicknesses.

2. The method of claim 1, wherein the implanting impurities comprises:
    a first implanting to control threshold voltages in the cell field region according to the first mask; and
    a second implanting to form a channel stop region under the device isolation films in the high-voltage field region according to the first mask.

3. The method of claim 1, wherein implanting impurities is preceded by removing all of the low-voltage gate-conductive film and all the low-voltage gate-conductive film in the cell field region, the high voltage gate-insulation film, the high-voltage gate-conductive film and a portion of the device isolation films in the high-voltage field region according to the first mask.

4. The method of claim 1, wherein the cell gate-insulation film comprises a tunneling insulation film on the substrate, a charge storage film on the tunneling insulation film, and a blocking insulation film on the charge storage film.

5. A method of fabricating a nonvolatile memory device, the method comprising:
    forming device isolation films on a substrate having a cell field region and a high-voltage field region, the device isolation films defining active regions of the substrate;
    forming a cell gate-insulation film and a cell gate-conductive film on the cell field region of the substrate including the device isolation films;
    forming a high-voltage gate-insulation film and a high-voltage gate-conductive film on the high-voltage field region of the substrate including the device isolation films, wherein a surface of the device isolation film on the high-voltage field region of the substrate is partially recessed to provide a groove therein; and
    forming a common gate-conductive film contacting the cell gate-conductive film and the high-voltage gate-conductive film, wherein the common gate-conductive film extends to the groove, a bottom surface of the common gate-conductive film in the groove is lower than a top surface of the substrate.

6. The method of claim 5, wherein a depth of the groove is larger than a thickness of the high-voltage gate-insulation film.

7. The method of claim 6, wherein an upper surface of the device isolation film in the cell field region is recessed.

8. The method of claim 6, wherein the cell gate-insulation film comprises a tunneling insulation film on the substrate, a charge storage film on the tunneling insulating film and a blocking insulation film on the charge storage film.

9. The method of claim 6, further comprising forming a common gate-conductive film on the high-voltage gate-conductive film and the cell gate-conductive film, wherein the high-voltage gate-conductive film includes an opening on the groove and the common gate-conductive film is provided in the groove and opening.

10. The method of claim 5, wherein a thickness of the high-voltage gate-insulation film is smaller than a distance between an edge of the device isolation film and the groove.

11. The method of claim 2, wherein the first implanting, the second implanting and the removing process are performed using same the first mask.

12. The method of claim 2, wherein the first implanting is performed before the second implanting.

13. The method of claim 2, wherein the first implanting and the second implanting have different implanting depths.

14. The method of claim 1, wherein the high-voltage gate-insulation film and the high-voltage gate-conductive film are not provided on the cell field region and the low-voltage field region.

15. The method of claim 1, wherein the low-voltage gate-insulation film and the low-voltage gate-conductive film are not provided on the high-voltage field region.

16. A method of fabricating a nonvolatile memory device, the method comprising:
    forming device isolation films on a semiconductor substrate having a cell field region, a high-voltage field region, and a low-voltage field region;
    forming a high-voltage gate-insulation film and a high-voltage gate-conductive film on the high-voltage field region,
    forming a low-voltage gate-insulation film and a low-voltage gate-conductive film both in the cell field region and the low-voltage field region of the substrate;
    forming a first mask on the substrate, wherein the first mask exposes a entire top surface of the low-voltage gate-conductive film in the cell field region, and exposes a top surface of the high-voltage gate-conductive film to reveal the device isolation films in the high-voltage field region, and covers a entire top surface of the low-voltage gate-conductive film in the low-voltage field region;

performing a first implanting to control threshold voltages in the cell field region according to the first mask;

performing a second implanting to form a channel stop region under the device isolation films in the high-voltage field region according to the first mask;

removing all the low-voltage gate-insulation film and all the low-voltage gate-conductive film in the cell field region, the high voltage gate-insulation film, the high-voltage gate-conductive film and a portion of the device isolation films in the high-voltage field region to form a groove therein according to the first mask;

after the implanting, forming a cell gate-insulation film and a cell gate-conductive film in the cell field region; and forming a common gate-conductive film contacting the cell gate-conductive film, the low-voltage gate-conductive film and the high-voltage gate-conductive film, wherein the common gate-conductive film extends to the groove, wherein the cell gate-insulation film, the low-voltage gate-insulation film and the high-voltage gate-insulation film have different material or different thickness.

* * * * *